United States Patent
Abbink

(10) Patent No.: US 7,382,002 B2
(45) Date of Patent: Jun. 3, 2008

(54) PHOTO-DETECTOR AND RELATED INSTRUMENTS

(75) Inventor: Henry C. Abbink, Westlake Village, CA (US)

(73) Assignee: Litton Systems, Inc., Los Angeles, CA (US)

( * ) Notice: Subject to any disclaimer, the term of this patent is extended or adjusted under 35 U.S.C. 154(b) by 107 days.

(21) Appl. No.: 11/009,438

(22) Filed: Dec. 9, 2004

(65) Prior Publication Data

US 2006/0125068 A1    Jun. 15, 2006

(51) Int. Cl.
  *H01L 29/768* (2006.01)
  *H01L 31/08* (2006.01)
(52) U.S. Cl. ............... 257/233; 257/292; 257/E25.032; 257/E31.058; 257/E33.077
(58) Field of Classification Search ............... 257/233, 257/292, 432, E25.032, E31.058, E31.076, 257/E33.077; 338/15
See application file for complete search history.

(56) References Cited

U.S. PATENT DOCUMENTS

| | | | |
|---|---|---|---|
| 4,792,931 A | 12/1988 | Nishida et al. | |
| 5,747,860 A * | 5/1998 | Sugiyama et al. | 257/432 |
| 6,147,349 A | 11/2000 | Ray | |
| 2001/0024460 A1 | 9/2001 | Yamamoto et al. | |
| 2002/0000510 A1 | 1/2002 | Matsuda | |
| 2004/0060355 A1 | 4/2004 | Nemirovsky et al. | |
| 2004/0222358 A1 | 11/2004 | Bui et al. | |
| 2006/0038209 A1 * | 2/2006 | Hashimoto | 257/294 |

FOREIGN PATENT DOCUMENTS

| | | |
|---|---|---|
| DE | 39 08 886 | 9/1990 |
| JP | 10048248 | 2/1998 |

OTHER PUBLICATIONS

International Search Report for corresponding international application PCT/US2005/017563, mailed May 19, 2006.
Partial International Search Report from corresponding international application PCT/US2005/035909, Mailed Feb. 24, 2006.

* cited by examiner

*Primary Examiner*—Long K. Tran

(57) ABSTRACT

An apparatus comprising at least one multilayer wafer includes a device layer adjacent to a barrier layer, and the device layer includes at least two photoconductive regions separated by an etched channel extending through the device layer. In some instances the apparatus may be an accelerometer having two photodiodes formed on a silicon-on-insulator (SOI) wafer with the photodiodes defined by one or more etched channels extending through the device layer of the SOI wafer. Also disclosed are methods for forming such an apparatus.

8 Claims, 4 Drawing Sheets

US 7,382,002 B2

PHOTO-DETECTOR AND RELATED INSTRUMENTS

FIELD OF THE INVENTION

The present invention relates generally to photodetectors, particularly photodetectors used in accelerometers, and methods for forming such photodetectors.

BACKGROUND OF THE INVENTION

In some accelerometers, a light source such as an light emitting diode (LED) is used in conjunction with a moveable shadow arm to project light onto a pair of photodiodes. Movement of the shadow arm caused by changes in acceleration experienced by the accelerometer results in changes in how light from the LED projects onto the photodiodes, and correspondingly affects current flow through the photodiodes. In such accelerometers, the photodiodes are often subject to and/or are the source of a number of problems. Such problems include, but are not necessarily limited to, excessive amounts of dark current (current arising from thermal energy rather than light), bias shifts resulting from minor shifts in light distribution, conductors blocking light, conductors increasing the distance between the shadow arm and photodiodes, and increased sensitivity of the accelerometer to temperature changes. As such, there is a need for improved photodiodes and methods of forming such diodes, particularly as they incorporated into accelerometers.

SUMMARY OF THE INVENTION

The present invention is directed to an apparatus comprising at least one multilayer wafer including a device layer adjacent to a barrier layer wherein the device layer comprises at least two photoconductive regions separated by an etched channel extending through the device layer. In some instances the apparatus may be an accelerometer comprising at least two photodiodes formed on a silicon-on-insulator (SOI) wafer wherein each diode comprises at least one photosensitive region of a device layer of the SOI wafer, each of the photosensitive regions of the at least two photodiodes being defined by one or more etched channels extending through the device layer of the SOI wafer.

BRIEF DESCRIPTION OF THE DRAWINGS

The exact nature of this invention, as well as the objects and advantages thereof, will become readily apparent from consideration of the following specification in conjunction with the accompanying drawings in which like reference numerals designate like parts throughout the figures thereof and wherein.

DETAILED DESCRIPTION OF THE PREFERRED EMBODIMENTS

Reference will now be made to the preferred embodiments of the invention, examples of which are illustrated in the accompanying drawings. While the invention will be described in conjunction with the preferred embodiments, it will be understood that these embodiments are not intended to limit the invention. On the contrary, the invention is intended to cover alternatives, modifications and equivalents, which may be included within the spirit and scope of the invention as defined by the appended claims. In the following detailed description, numerous specific details are set forth in order to provide a thorough understanding of the present invention. However, it will be understood by one of ordinary skill in the art that the present invention may be practiced without these specific details. In other instances, well known methods, procedures, components, and circuits have not been described in detail so as not to unnecessarily obscure the important aspects of the present invention.

Figure 1:
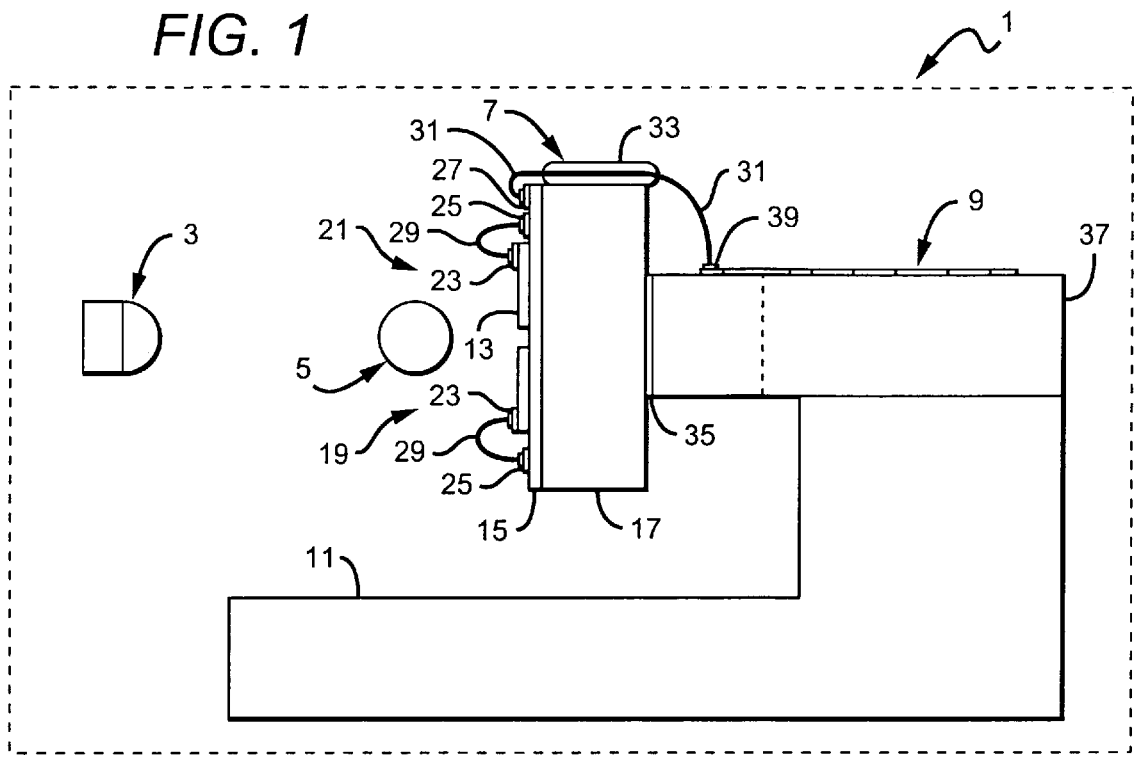
FIG. 1 is preferred accelerometer according to the present invention.

In FIG. 1, a preferred accelerometer 1 comprises a light source 3 in the form of an LED, a shadow arm 5, a photodiode assembly 7, an electrical circuit assembly 9, and an accelerometer sub-plate 11. The shadow arm 5 is moveably coupled between the light source 3 and the photodiode assembly 7 such that it forms a shadow in the light from the source 3 projecting onto the assembly 7, and acceleration of the accelerometer 1 causes a corresponding movement of the arm 3 and a shift in the light from the source 3 projected onto the assembly 7.

The photodiode assembly 7 is formed from a multi-layer wafer comprising a device layer 13, a barrier layer 15, and a handle layer 17, and includes photodiodes 19 and 21, electrically conductive pads/traces 23, 25, and 27, wirebonds 29 and 31, and epoxy 33. The photodiodes 19 and 21 each comprise a photosensitive region of the device layer 13 where the device layer 13 has been etched to separate the photosensitive regions of the photodiodes 19 and 21. The pads/traces 23 are positioned so as to be in direct contact with the photosensitive regions of diodes 19 and 21. The pads/traces 25 are positioned to be electrically isolated from pads/traces 23 other than through the wirebonds 29, and the pads/traces 27 are electrically coupled to and/or extensions of the pads/traces 25. The wirebonds 31 are used to electrically couple pads/traces 25 to chip assembly 9, and are bonded to the handle portion 17 of photodiode assembly 7 by epoxy 33.

The photodiode assembly 7 is physically bonded to the body 37 of the circuit assembly 9 by the bonding layer 35, and electrically coupled via the wirebonds 31 to the electrically conductive pads/traces 39 of the circuit assembly 9. In some instances circuit assembly 9 will consist essentially of conductors on a substrate, while in other instances it may comprise additional electrical components, such components possibly including but not being limited to resistors, capacitors, inductors, diodes, transistors, and operational amplifiers.

Figure 2:
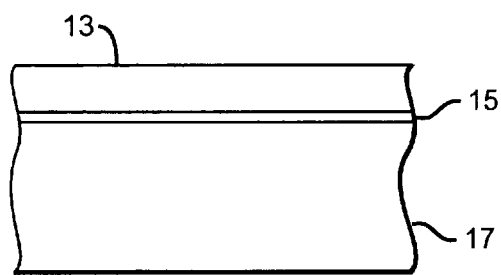
FIG. 2 is a multi-layer wafer.
Figure 3:
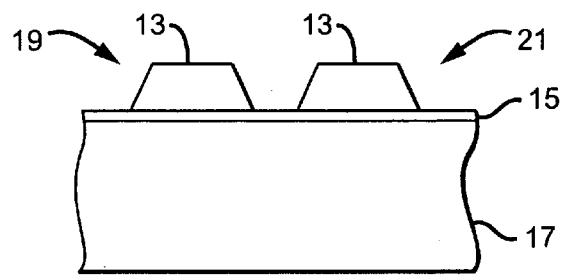
FIG. 3 is the wafer of FIG. 2 after formation and separation of photosensitive areas.
Figure 4:
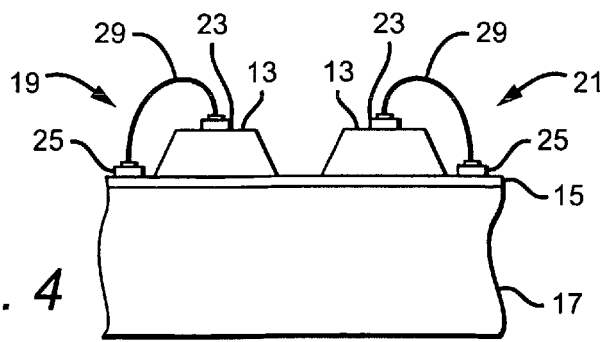
FIG. 4 is the wafer of FIG. 3 after metallization and wirebonding.

FIGS. 2-4 illustrate a method of forming a photo-detector. In FIG. 2, a SOI wafer comprises a silicon device layer 13 separated from a silicon handle layer 17 by a layer of silicon oxide 15. All or portions of the device layer 13 are doped or otherwise treated to make at least two desired regions photosensitive. The at least two photosensitive regions are then isolated from each other and from any other portions of the device layer 13 by etching through the device layer 13 (and possibly through the oxide layer 15). As shown in FIG. 3, the at least two regions correspond to two photodiodes 19 and 21 being formed. After etching, the SOI is metalized to form pads and/or traces 23 and 25, and possibly also to mask portions of the photosensitive regions. After the pads and/or traces are formed, gold wirebonds 29 are coupled to and extended between the pads/traces 23 positioned on/in the photosensitive regions with other pads/traces 25 that are on the SOI wafer, but not on/in the photosensitive regions. As illustrated by FIG. 1, the handle layer 17 can then be physically bonded to the body 37 of the circuit assembly 9 by the bonding layer 35, and electrically coupled via the wirebonds 31 extending between pads/traces 27 and the electrically conductive pads/traces 39 of the circuit assembly 9.

Although described as having gold wirebonds, other embodiments may utilize other types of wirebonds such as aluminum wirebonds. Similarly the pads and traces described may comprise any conductive material that can be coupled to the device layer, but in many instances will comprise aluminum, and in some instances function both as a pad and as a light shield.

FIGS. 5-8 also illustrate a method of forming a photodetector. The method of FIGS. 5-8 is substantially similar to that of FIGS. 2-4. As such, additional understanding might be obtained if FIGS. 5-8 are viewed as if they provide a top view of a method of forming a device shown in side views in FIGS. 2-4.

Figure 5:
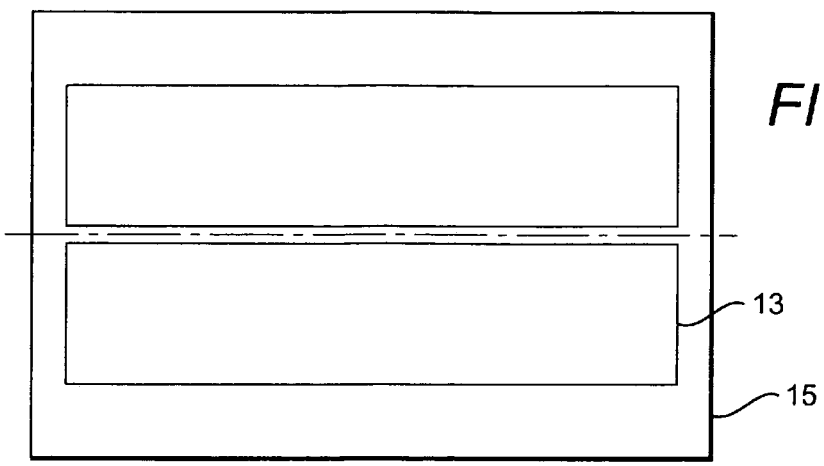
FIG. 5 is a top view of a wafer after the device layer has been removed from non-diode areas.

In FIG. 5, a SOI wafer comprises a silicon device layer 13 separated from a silicon handle layer by a layer of silicon oxide 15. In FIG. 5, portions of the device layer that will not be used to form photo-diodes have been removed by etching to expose silicon oxide layer 15. Separating the device layer of a wafer into photodiode pairs by etching rather than mechanical methods eliminates the possibility of such cutting forming micro fissures that extend into the photodiodes, and as a result, decreases the amount of dark current resulting from such micro fissures.

Figure 6:
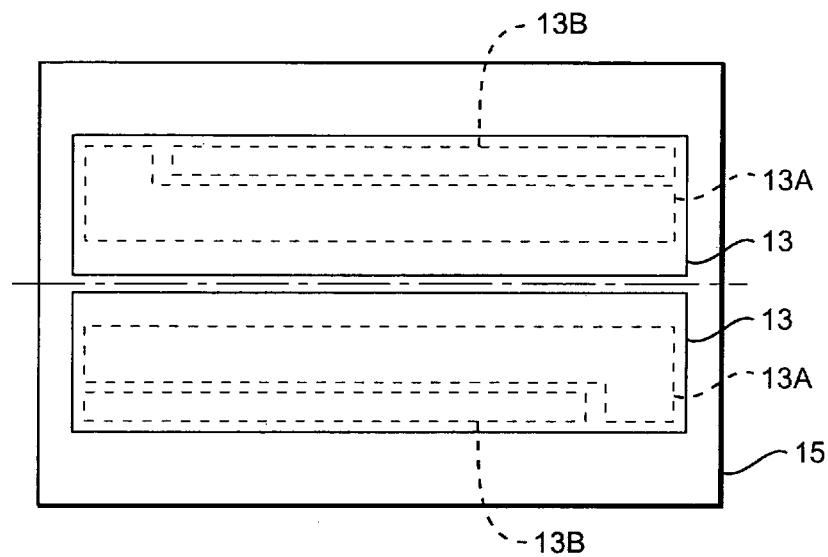
FIG. 6 is a top view of the wafer of FIG. 4 illustrating doping regions
Figure 7:
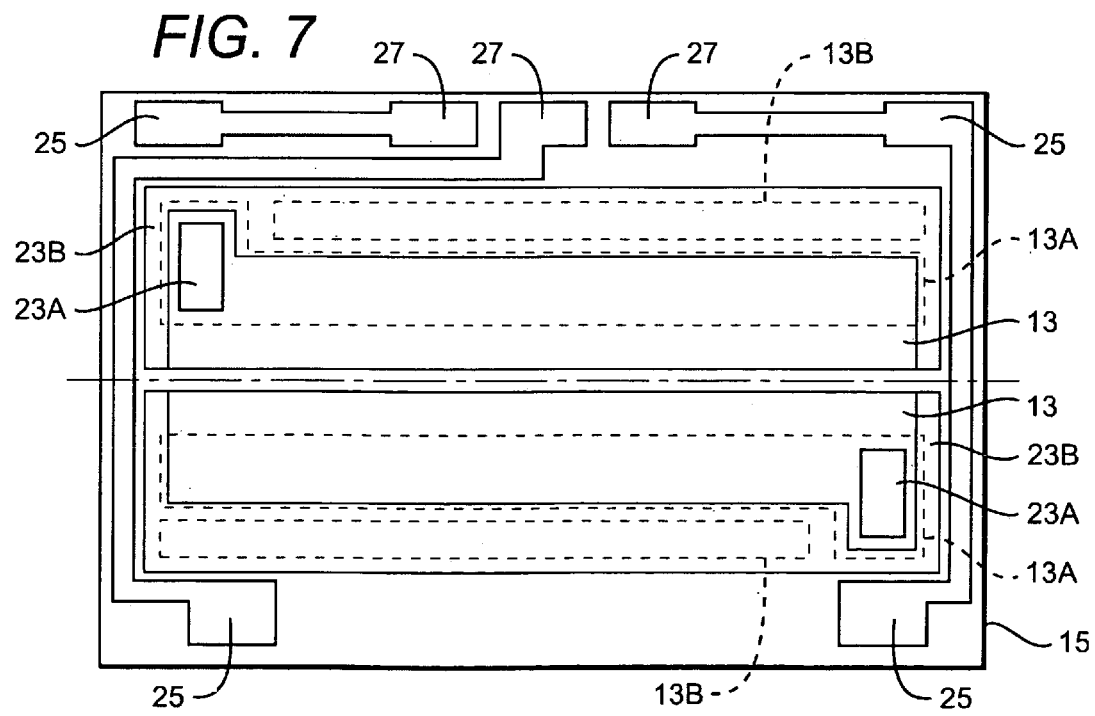
FIG. 7 is a top view of the wafer of FIG. 5 after metallization.
Figure 8:
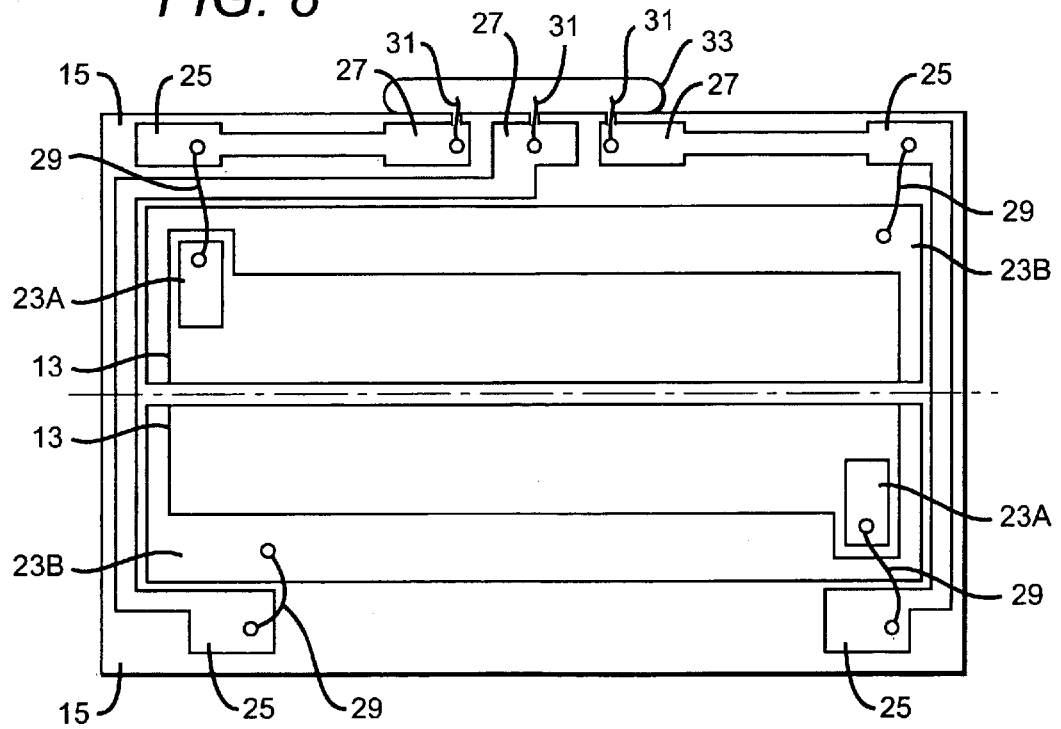
FIG. 8 is a top view of the wafer of FIG. 6 after wirebonding.

In FIG. 6, the remaining portions of the device layer 13 are doped to form areas 13A of P+ diffusion, and areas 13B of N+ diffusion. In FIG. 7, metallization has been performed to form pads 25, 27, 23A and 23B where pads 23B are in the form of light shields covering the areas of N+ diffusion and portions of the areas of P+ diffusion. In FIG. 8, wirebonds 29 and 33 have been added as has epoxy 33.

It is important to note that providing pads 25 and 27, and the traces coupling the pads, shortens and simplifies the routing of wirebonds 29. As the wirebonds 29 need not be routed over any conductive surfaces other than those they are electrically bound to, there is no need to utilize epoxy or some other materials to isolate central portions of the wirebonds from the surfaces they are adjacent to. The elimination of epoxy on the surface eliminates the possibility of such epoxy interfering with the performance of the device through negative effects from thermal expansion and/or contraction. As can be seen, some of the traces form conductive paths extending from one side of the device to the other such that wirebonds coupling the device to an external circuit are all located on a single side of the device without having any wirebonds extending between the two photo-diodes.

It is contemplated that pads/traces 25 may advantageously be formed on the silicon oxide layer 15, or on a portion of device layer 13 that has been electrically isolated from the photodiode portions of layer 13.

It is contemplated that, prior to bonding the handle layer 17 to body 37, wirebonds 31 may be coupled to pads/traces 25 and bonded via epoxy to a side or back of the SOI wafer. In such a form, the assembly is readily handled and transported, and suited for later mounting to the body 37 and electrical connection to the pads/traces 39 of the circuit assembly 9.

Figure 10:
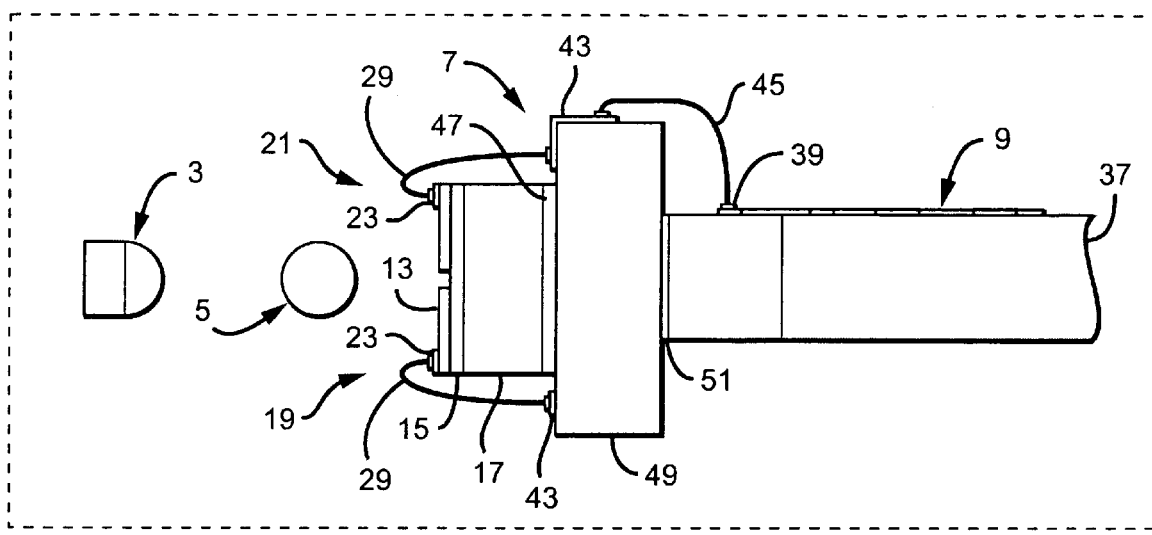
FIG. 10 is a alternate embodiment of an accelerometer according to the present invention.

In some embodiments, such as that shown in FIG. 10, the wirebonds may extend between pads/traces on the photodiodes to pads/traces positioned off of the SOI wafer. For such embodiments, after etching and metallization, the handle layer 17 may be physically bonded to a ceramic carrier 49 comprising pads/traces 43 using bonding layer 47. Gold wirebonds are then positioned between pads/traces 23 on the SOI wafer that are photodiode connectors and pads/traces 43 on the ceramic carrier. Afterwards, the ceramic carrier can be physically bonded to the body 37 of the circuit assembly 9 by the bonding layer 51, and electrically coupled via the wirebonds 45 to the electrically conductive pads/traces 39 of the circuit assembly 9.

Figure 9:
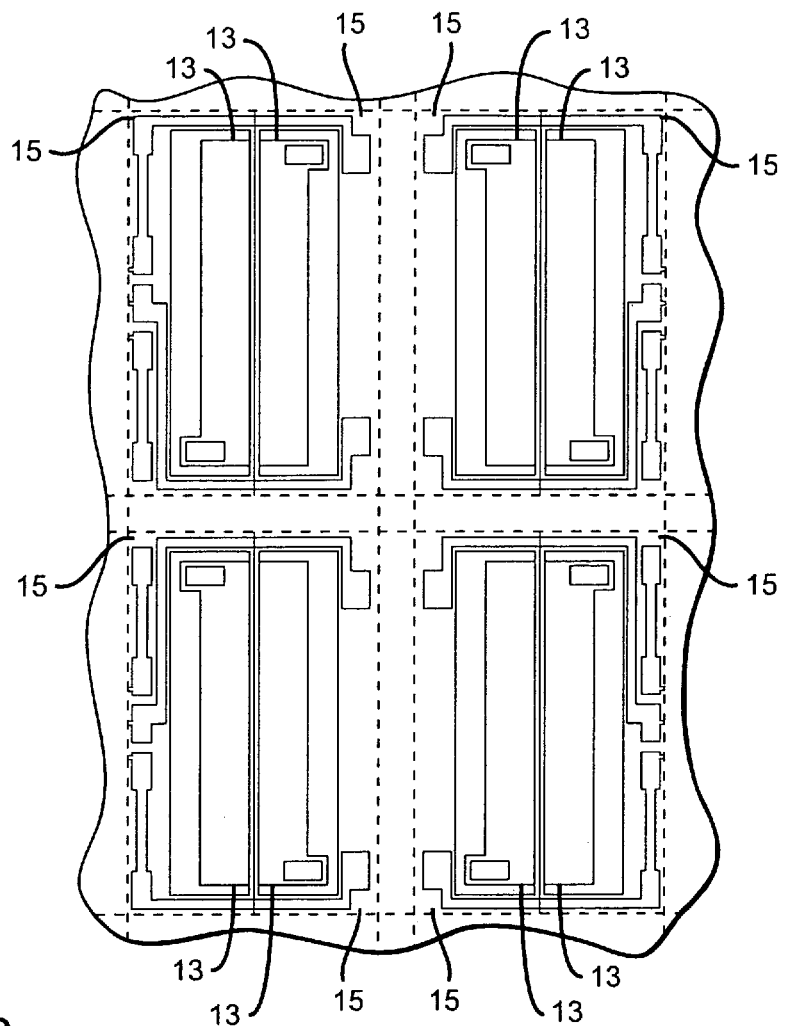
FIG. 9 illustrates a dicing pattern.

It is contemplated that after the photosensitive regions are isolated via etching, and after light shields, pads, and/or traces having been added by metallization, individual regions, or groups of regions that were simultaneously formed on the SOI wafer may be separated, possibly by dicing or some other mechanism. FIG. 9 illustrates one of many possible dicing patterns. The pattern of FIG. 9 forms pairs of photodiodes positioned relative to each other. Dicing, as used herein, refers to a mechanical process of separation rather than a chemical process, and includes at least slicing, sawing, and other cutting methods where an external force is applied to the wafer to separate the wafer into pieces.

Figure 11:
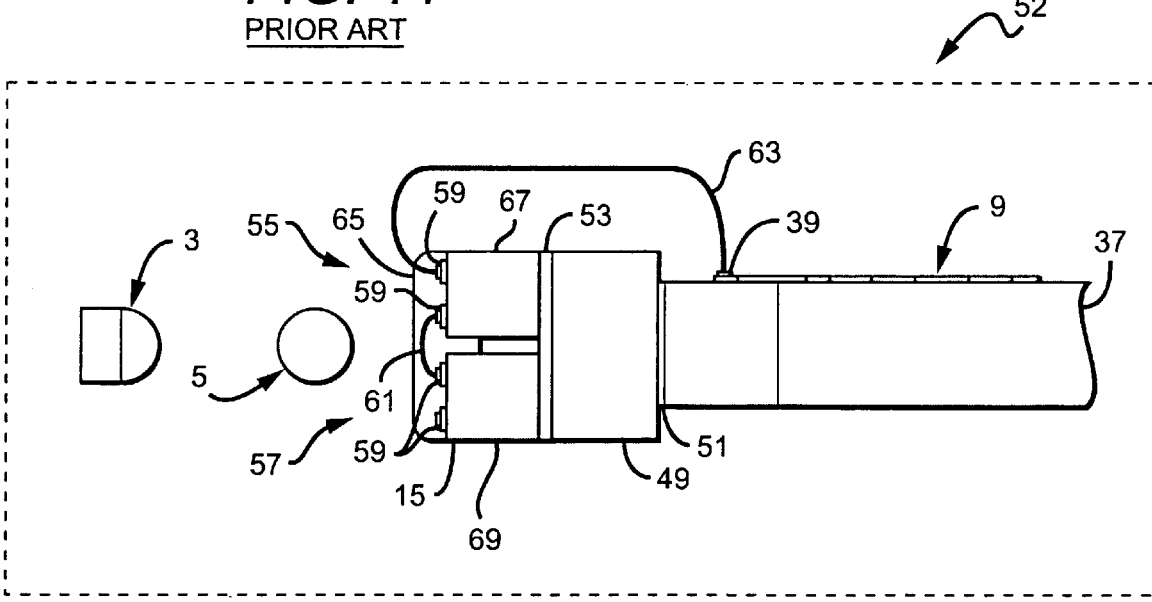
FIG. 11 illustrates a prior art accelerometer.

The present invention provides many benefits over previous accelerometers such as accelerometer 52 of FIG. 11. In the device of FIG. 11, photodiodes 55 and 57 are formed on silicon substrates 67 and 69. Pads/traces 59 provide connections to photodiodes 55 and 57, and wirebonds 61 and 63 provide electrical connections between pads/traces 59 and pads/traces 9. Epoxy 65 insures that wirebonds 61 and 63 do not move inappropriately, and electrically isolates them from portions of the photodiodes they should not come in contact with. Substrates 67 and 69 are formed by mechanically separating a common substrate after it has been bonded to carrier 49 by layer 53. Carrier 49 is in turn bonded to body 37 via layer 51. As can be seen, photodiodes 55 and 57 must be positioned relative to each other with such relative positions being impacted by the process of bonding the photodiodes to carrier 49. Moreover, epoxy 65 can extend between the photodiodes and by expanding and contracting in response to temperature, humidity, etc., can cause undesired movement between the photodiodes. The substrates 67 and 69 will typically be formed by dicing with resultant damage extending into the photosensitive areas of diodes 55 and 57.

It is contemplated that any member described herein may unless specifically limited comprise a single piece or an assembly of pieces and each such piece may comprise any material or combination of materials that renders the piece suitable for its intended function. Similarly, the pieces, assemblies, and/or members may be sized and dimensioned in any manner that allows them to be used for their intended function. That being said, it is contemplated that some SOI wafer used as described herein may have a diameter of 4", 5", 6" or 8", may have a device layer that is 1 to 200 microns thick, may have a thermal oxide layer that is 0.1 to 2 microns thick, and may have a handle layer that is 300 to 800 microns thick.

It is contemplated that the methods and apparatus disclosed herein provide benefits over prior art methods and apparatus at least in part because: (a) photosensitive regions are separated by etching rather than by dicing to eliminate damage caused by dicing; and (b) there is no need for epoxy on the device layer or in any other location where thermal expansion and/or contraction of the epoxy can impact the relative positions of the photodiodes.

The embodiments of the present invention described herein comprise multiple novel features with each described embodiment including either a single such feature or a combination of such features. Other contemplated embodiments include all combinations of one or more such novel features not explicitly described herein as such combinations are readily discernable from the embodiments described. In light of the various contemplated embodiments, the present invention can be characterized in a number of ways with the following paragraphs providing examples of some such characterizations.

In some instances, an embodiment of the present invention may be characterized as an apparatus comprising at least one multilayer wafer, the at least one multi-layer wafer including a device layer adjacent to a barrier layer, wherein the device layer comprises at least two photoconductive regions separated by an etched channel extending through the device layer.

In some such instances, an embodiment of the present invention may also be characterized as an accelerometer comprising at least two photodiodes formed on a silicon-on-insulator (SOI) wafer wherein each diode comprises at least one photosensitive region of a device layer of the SOI wafer, each of the photosensitive regions of the at least two photodiodes being defined by one or more etched channels extending through the device layer of the SOI wafer. Some such embodiments may also be characterized as satisfying or including one or more of the following: (a) the at least two photodiodes is electrically coupled to at least one electrically conductive pad or trace that is positioned on the SOI wafer but outside the photosensitive regions; (b) the at least one electrically conductive pad or trace is formed on an oxide layer of the SOI wafer underlying the device layer; (c) the at least one electrically conductive pad or trace is formed on a handle layer of the SOI wafer underlying an oxide layer of the SOI wafer underlying the device layer; (d) each photodiode is electrically coupled by a wirebond extending between an electrically conductive pad or trace formed on one of the photosensitive regions and an electrically conductive pad or trace formed outside of the photosensitive regions; (e) a plurality of electrically conductive pads or traces formed outside of the photosensitive regions that are electrically connected via a plurality of wirebonds to a plurality of electrically conductive pads or traces that are not formed on the SOI wafer wherein the plurality of wirebonds are bonded to a side of the SOI wafer; (f) an electrical circuit wherein the plurality of wirebonds bonded to a side of the SOI wafer are electrically coupled to the circuit; (g) a plurality of electrically conductive pads or traces formed outside of the photosensitive regions that are electrically connected via a plurality of wirebonds to a plurality of electrically conductive pads or traces that are formed on a carrier coupled to the SOI wafer opposite the device layer; (h) an electrical circuit and a plurality of wirebonds extending between a plurality of electrically conductive pads or traces that are formed on the carrier and the circuit.

In some instances, an embodiment of the present invention may also be characterized as having at least X photoconductive regions are positioned sufficiently far apart such that they can subsequently be separated by dicing without the dicing causing significant damage to the photoconductive regions where X is one of 2, 5, 10, 100, and 1000.

In some instances, an embodiment of the present invention may be characterized as an accelerometer comprising at least two photodiodes wherein the position of the photodiodes relative to each other is determined by the size and position of one or more removed regions of a device layer used to form the at least two photodiodes. In some such instances, the accelerometer may be characterized as satisfying or including one or more of the following: (a) the accelerometer comprises at least one multilayer wafer including a device layer adjacent to a barrier layer and a handle layer coupled to the barrier layer opposite the device layer; (b) the device layer comprises at least two photoconductive regions separated by an etched channel extending through the device layer; (c) the barrier layer comprises at least one conductive trace extending from a first side of the barrier layer comprising a first of the at least two photodiodes to a second side of the device layer comprising a second of the at least two photodiodes; (d) the first side is opposite the second side; and (e) the accelerometer comprises a plurality of wirebonds but none of the wirebonds extend between the first and second sides.

In some instances, an embodiment of the present invention may be characterized as an apparatus including a plurality of photodiodes formed by: (a) obtaining a multilayer wafer comprising at least a device layer separated from a handle layer by a barrier layer; (b) modifying the device layer to form a plurality of photoconductive regions; (c) separating the photoconductive regions by etching away the device layer between the photoconductive regions; and (d) forming a first plurality of electrically conductive pads or traces on the photoconductive regions. In some instances, such an embodiment may further be characterizes as including or satisfying one or more of the following: (i) wirebonding at least one wire to at least some of the first plurality of electrically conductive pads or traces; (ii) separating the photoconductive regions by etching away the device layer between the photoconductive regions comprises using reactive ion etching; (iii) forming a second plurality of electrically conductive pads or traces on the device layer other than on the photoconductive regions; (iv) the second plurality of electrically conductive pads or traces is formed on the barrier layer; (v) electrically coupling at least some of the first plurality of electrically conductive pads or traces with at least some of the second plurality of electrically conductive pads or traces by wirebonding; and (vi) electrically coupling at least some of the first plurality of electrically conductive pads or traces with at least some of the second plurality of electrically conductive pads or traces by wirebonding.

What is claimed is:

1. An apparatus comprising at least one multilayer wafer including a device layer adjacent to a barrier layer, the device layer having at least two photoconductive regions separated by an etched channel extending through the device layer, the etched channel being sufficiently wide to accommodate dicing by slicing or sawing, whereby the wafer can subsequently be separated by dicing without causing microfissures to extend into the separated photoconductive regions.

2. The apparatus of claim 1 wherein the apparatus is an accelerometer comprising at least two photodiodes formed on a silicon-on-insulator (SOI) wafer wherein each diode comprises at least one photosensitive region of a device layer of the SOI wafer, each of the photosensitive regions of the at least two photodiodes being defined by one or more etched channels extending through the device layer of the SOI wafer.

3. The apparatus of claim 2 wherein each of the at least two photodiodes is electrically coupled to at least one electrically conductive pad or trace that is positioned on the SOI wafer but outside the photosensitive regions.

4. The apparatus of claim 3 wherein the at least one electrically conductive pad or trace is formed on an oxide layer of the SOI wafer underlying the device layer.

5. The apparatus of claim 3 wherein each photodiode is electrically coupled by a wirebond extending between an electrically conductive pad or trace formed on one of the photosensitive regions and an electrically conductive pad or trace formed outside of the photosensitive regions.

6. The apparatus of claim 1 wherein the device layer comprises at least X photoconductive regions separated by a plurality of etched channels extending through the device layer, the photoconductive regions being positioned so that they can subsequently be separated by dicing without the dicing causing micro fissures to extend into the photoconductive regions wherein X is one of 5, 10, 100, and 1000.

7. An accelerometer comprising:

at least one multilayer wafer, the at least one multi-layer wafer including at least two photodiodes formed on a silicon-on-insulator (SOI) wafer, wherein each diode comprises at least one photosensitive region of a device layer of the SOI wafer, each of the photosensitive regions of the at least two photodiodes being defined by one or more etched channels extending through the device layer of the SOI wafer, each of the at least two photodiodes being electrically coupled to at least one electrically conductive pad or trace that is positioned on the SOI wafer but outside the photosensitive regions; and a plurality of electrically conductive pads or traces formed outside of the photosensitive regions that are electrically connected via a plurality of wirebonds to a plurality of electrically conductive pads or traces that are not formed on the SOI wafer wherein the plurality of wirebonds are bonded to a side of the SOI wafer.

8. The accelerometer of claim 7 further comprising an electrical circuit wherein the plurality of wirebonds bonded to a side of the SOI wafer are electrically coupled to the circuit.

* * * * *